(12) United States Patent
Falk (10) Patent No.: US 10,576,733 B2
(45) Date of Patent: Mar. 3, 2020

(54) TUNEABLE FLAT PANEL UV EXPOSURE SYSTEM FOR SCREEN PRINTING

(71) Applicant: M&R Printing Equipment, Inc., Roselle, IL (US)

(72) Inventor: Keith R. Falk, Cary, IL (US)

(73) Assignee: M&R Printing Equipment, Inc., Roselle, IL (US)

( * ) Notice: Subject to any disclaimer, the term of this patent is extended or adjusted under 35 U.S.C. 154(b) by 140 days.

(21) Appl. No.: 15/470,174

(22) Filed: Mar. 27, 2017

(65) Prior Publication Data
US 2018/0229492 A1 Aug. 16, 2018

Related U.S. Application Data (60) Provisional application No. 62/458,680, filed on Feb. 14, 2017.

(51) Int. Cl.
| | | |
|---|---|---|
| A61N 5/06 | (2006.01) | |
| B41F 15/12 | (2006.01) | |
| G03F 7/20 | (2006.01) | |

(52) U.S. Cl.
CPC ............ B41F 15/12 (2013.01); G03F 7/2057 (2013.01)

(58) Field of Classification Search
USPC .................................................... 250/504 R
See application file for complete search history.

(56) References Cited

U.S. PATENT DOCUMENTS

| | | | |
|---|---|---|---|
| 7,115,353 B2 | 10/2006 | Baxter et al. | |
| 7,502,950 B1 * | 3/2009 | Brands ................... | G06F 3/1446 323/234 |
| 8,268,533 B2 | 9/2012 | Daems et al. | |
| 8,803,109 B1 * | 8/2014 | Mcpherson ............ | B05D 3/067 250/492.1 |
| 9,669,615 B2 | 6/2017 | McPherson | |
| 10,180,248 B2 * | 1/2019 | Murphy ................ | F21V 17/107 |
| 2002/0192569 A1 * | 12/2002 | Ulland ................ | G03F 7/70391 430/5 |
| 2005/0072325 A1 * | 4/2005 | Baxter ...................... | G03F 7/12 101/127.1 |
| 2006/0001849 A1 * | 1/2006 | Ray ........................... | B41J 2/45 355/50 |
| 2006/0093235 A1 | 5/2006 | Bourne et al. | |
| 2008/0047445 A1 | 2/2008 | Berner | |
| 2009/0160330 A1 * | 6/2009 | Hsu ..................... | H01L 25/0753 313/506 |
| 2011/0049392 A1 * | 3/2011 | Martinez ............... | H01L 33/648 250/492.1 |
| 2011/0062889 A1 * | 3/2011 | Hoogzaad .............. | G09G 3/342 315/294 |

(Continued)

FOREIGN PATENT DOCUMENTS

JP 4-163459 A 6/1992

*Primary Examiner* — Rodney E Fuller
(74) *Attorney, Agent, or Firm* — Greensfelder, Hemker & Gale, P.C.

(57) ABSTRACT

A tuneable flat panel UV exposure system for screen printing is provided. The panel includes a plurality of UV LED chips where each chip is connected to multiple, independently controllable power sources and pulse width modulation circuits. The power sources allow an operator to control a plurality of different wavelength outputs independently for each UV LED in the panel.

22 Claims, 6 Drawing Sheets

(56) References Cited

U.S. PATENT DOCUMENTS

| | | | |
|---|---|---|---|
| 2011/0111134 A1* | 5/2011 | Gore | B41F 23/0406 |
| | | | 427/555 |
| 2011/0204797 A1* | 8/2011 | Lin | H05B 33/0827 |
| | | | 315/161 |
| 2012/0007912 A1 | 1/2012 | Kagose et al. | |
| 2012/0127214 A1* | 5/2012 | Han | G09G 3/342 |
| | | | 345/690 |
| 2012/0157561 A1* | 6/2012 | Gould | B41J 11/002 |
| | | | 522/16 |
| 2012/0305946 A1* | 12/2012 | Kuk | B41J 2/45 |
| | | | 257/80 |
| 2013/0070035 A1 | 3/2013 | Yang et al. | |
| 2014/0038108 A1* | 2/2014 | D'Amelio | B05D 3/067 |
| | | | 430/308 |
| 2015/0336372 A1* | 11/2015 | Van Ness | B41C 1/14 |
| | | | 427/508 |
| 2016/0227616 A1* | 8/2016 | Lee | H05B 33/0815 |
| 2017/0064785 A1* | 3/2017 | Kim | H05B 33/086 |
| 2017/0343168 A1* | 11/2017 | Ting | H01L 33/54 |

\* cited by examiner

TUNEABLE FLAT PANEL UV EXPOSURE SYSTEM FOR SCREEN PRINTING

CROSS-REFERENCE TO RELATED APPLICATIONS

The present invention claims the benefit of U.S. Provisional Patent Application No. 62/458,680, filed Feb. 14, 2017, the contents of which are incorporated herein by reference.

FEDERALLY SPONSORED RESEARCH OR DEVELOPMENT

N/A

FIELD OF THE INVENTION

The present invention is generally directed to a tuneable flat panel ultraviolet exposure system used for screen printing.

DESCRIPTION OF THE PRIOR ART

Known fixed UV LED screen printing exposure systems are limited to a single wavelength output or mixture of wavelength outputs which are not independently controllable as a single source. This lack of control can be problematic for certain exposure applications that require multiple UV peaks of varying intensity and exposure time.

For years, such systems were limited to mercury vapor or metal halide lamps that output UV light in different areas. In some instances, users would switch out lamps depending on what they were exposing. The term "multi-spectrum" came about later with metal halide lamps having different additives that covered a wider area of usable UV light. Some current units now use a mixture of LED lights with different spectral outputs in the hopes of getting enough of the correct wavelength for a particular emulsion chemistry to cure upon exposure. Such units were only able to control the length of exposure time The present application provides an improved UV LED system with control over a number of parameters of the lighting source.

SUMMARY OF THE INVENTION

The present system provides a panel having an array of multiple wavelength point sources which are controlled together to provide a homogenous exposure of multiple wavelength peaks (e.g., preferably up to six wavelengths). The sources are independently adjustable for intensity, duty cycle and exposure time as well as timing sequence. The system is preferably used to facilitate curing of an emulsion used in a screen printing operation.

The present invention provides a flat panel ultraviolet ("UV") exposure system which allows an operator to precisely control a plurality of different wavelength outputs independently and simultaneously for both duty cycle and intensity for each LED in the panel. The system includes an aluminum panel array of multi-channel (e.g., three channels) UV LED chips connected in parallel with custom termination boards. The LED chips are supplied by a plurality of adjustable voltage (e.g., DC) power supplies (e.g., again three). Each of the power supplies can be modulated at a frequency of 1 KHz and a duty cycle of 0-100%.

The present system provides a variable spectral output that can be controlled to cure a large variety of different emulsions. The system enables control of light output in a plurality (e.g., three) of different spectral (i.e., wavelength, in nanometers) ranges by supporting individual adjustment of the light output from 0-100% in each of the ranges. The system can be used to dial in the correct ranges (e.g., in nanometers) that are the best match for a particular emulsion being exposed. For example, when dealing with an unusually fast emulsion the percentage of light output can be reduced to give more latitude to the exposure. In some instances, more than one type of emulsion is used for different application. The present system will allow the user to fine tune the light output for each emulsion.

In accordance with one aspect of the present invention, a tuneable UV exposure system is provided. The system comprises a panel having a plurality of UV LED chips. Each of the plurality of UV LED chips is connected to a plurality of controllable power sources where each power source is set at a different output value. Each of the power sources can be a constant voltage, constant current supply. The LED chips are capable of emitting light at multiple wavelengths (i.e., multi-wavelength LED chips).

Each of the plurality of power sources is connected to a controllable pulse width modulation circuit. The pulse width modulation circuit can control a duty cycle of each chip from 0-100% at 1 KHz.

Each of the plurality of power sources and pulse width modulation circuits is adjustable. Moreover, each of the plurality of power sources and pulse width modulation circuits is controlled by a programmable logic controller or other similar device. The programmable logic controller includes a human/machine interface (i.e., a user interface).

The panel can comprise a plurality of strips where each strip includes a portion of the plurality of UV LED chips in a single line. The strips of UV LED chips can be arranged such that adjacent strips of the plurality of strips are positioned to stagger the UV LED chips in an alternating pattern.

The UV LED chips of a first strip of the plurality of strips (and thereafter, alternating strips) can be connected to a first set of power sources of the plurality of power sources where each of the first set of power sources is different from each other. Similarly, the UV LED chips of a second strip of the plurality of strips (and again, thereafter alternating strips) can be connected to a second set of power sources of the plurality of power sources where each of the second set of power sources is different from each other and from each of the first set of power sources. In this manner, the panel can provide an exposure from both the first plurality of power sources and the second plurality of power sources (e.g., if each LED chip is connected to three power sources, than the panel can provide six different wavelengths of light).

Each of the UV LED chips can include a plurality of different wavelength dies under a single lens. For example, each chip can include three different wavelength dies. The dies can be controlled by three different power sources.

In another aspect of the present invention, a tuneable UV exposure system for curing a substance on a substrate in a screen printing operation is provided. The system comprises a panel comprising a plurality of strips where each strip contains a plurality of UV LED chips. The system also includes a plurality of adjustable power sources connected to each of the UV LED chips on each of the plurality of strips.

The panel is positioned to expose a surface of a substrate in a screen printing apparatus. The substrate can be an emulsion coated screen.

Further aspects of the invention are shown in the Figures and are described herein.

BRIEF DESCRIPTION OF THE DRAWINGS

To understand the present invention, it will now be described by way of example, with reference to the accompanying drawings in which:

FIG. 8 is a top perspective view of an LED panel in accordance with the present invention; and, FIG. 9 is a partial schematic top plan view of a plurality of strips of LED chips controlled by three power sources and pulse width modulators via high speed relays each along with a Programmable Logic Controller (PLC) and user interface (HMI).

DETAILED DESCRIPTION

While this invention is susceptible of embodiments in many different forms, there is shown in the drawings, and will herein be described in detail preferred embodiments of the invention with the understanding that the present disclosure is to be considered as an exemplification of the principles of the invention and is not intended to limit the broad aspect of the invention to the embodiments illustrated.

Figure 1:
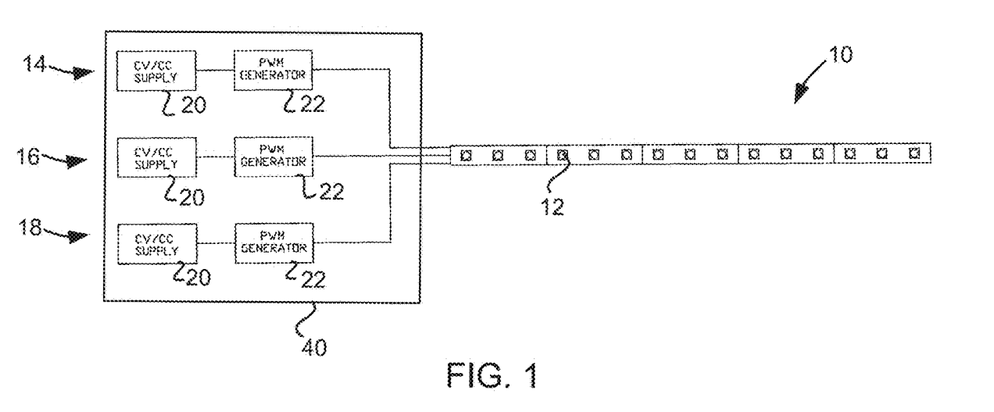
FIG. 1 is a partial schematic top plan view of a first strip of LED chips controlled by three power sources.

Referring to FIG. 1, a three-channel LED strip 10 is shown having a plurality of LED UV light emitters or chips 12. Each chip 12 includes three different wavelength dies under a single lens. The strip 10 is electrically coupled to three separate modulated power sources 14, 16, 18. The power sources 14, 16, 18 are connected in parallel to the LED chips 12 on the strip 10. Each modulated power source 14, 16, 18 includes a CV/CC (constant voltage/constant current) Supply 20 and a PWM (pulse width modulation) generator 22. Each chip 12 on a particular strip 10 respond identically to the power sources 14, 16, 18.

Figure 7:
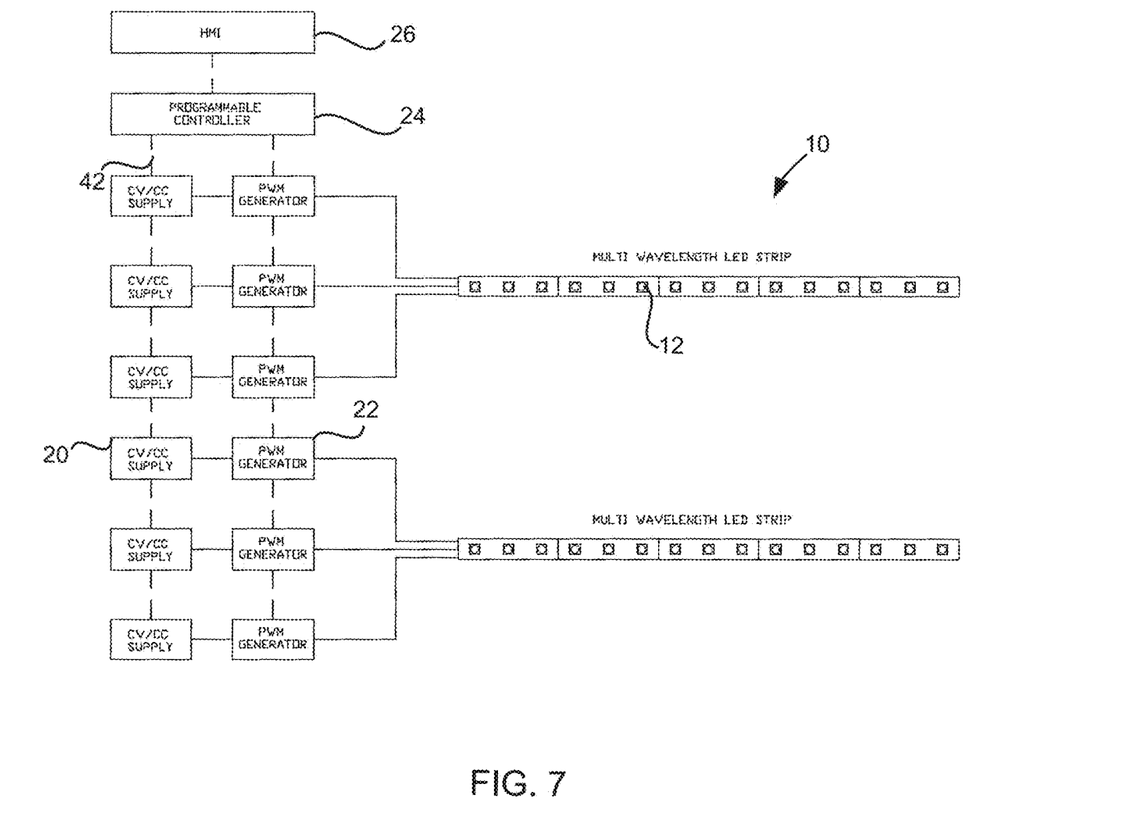
FIG. 7 is partial schematic top plan view of a plurality of strips of LED chips controlled by three power sources and pulse width modulators each along with a Programmable Logic Controller (PLC) and a user interface (HMI)

As shown in FIG. 7, a PLC (programmable Logic Controller) 24 having a user interface 26 (i.e., HMI—human machine interface) can be used to control the modulated power sources 14, 16, 18 for all the strips 10 forming an LED panel 28 (i.e. a grid of LED chips 12). Other similar devices (e.g., a computer) can be also be used for such control.

Figure 2:
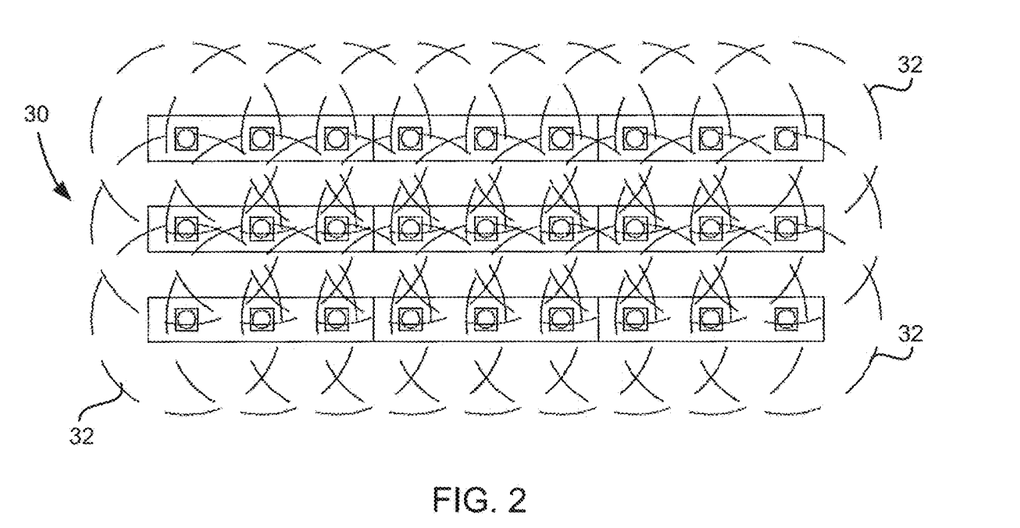
FIG. 2 is a top plan view of an array of a plurality of aligned strips of LED chips illustrating overlapping light exposure (i.e., emission cone) from each of the LED chips.
Figure 3:
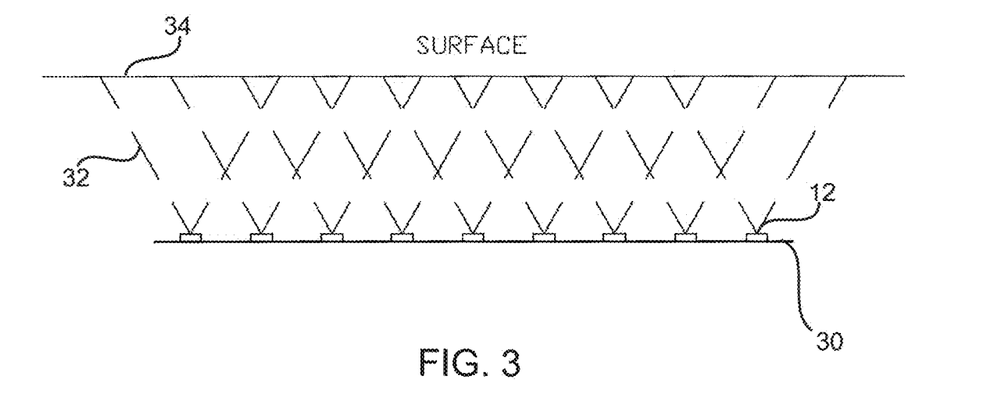
FIG. 3 is a side plan view of the array of FIG. 2 with a substrate surface exposed to the LED chips.

FIG. 2 shows an array 30 of three LED strips 10 (i.e., the array 30 can be an LED panel or part of a bigger LED panel). The LED chips 12 in this array 30 are aligned. Each of the LED chips 12 act as a point source of three independently controllable wavelength peaks (i.e., as controlled by the three modulated power sources 14, 16, 18). An emission cone 32 is shown in phantom for each of the chips 12. As illustrated in FIGS. 2 and 3, the surface of a substrate 34 is positioned so that the emission cone 32 of each LED chip 12 overlap with adjacent, equidistant chips 12 to produce a uniform exposure at the surface 34.

Figure 4:
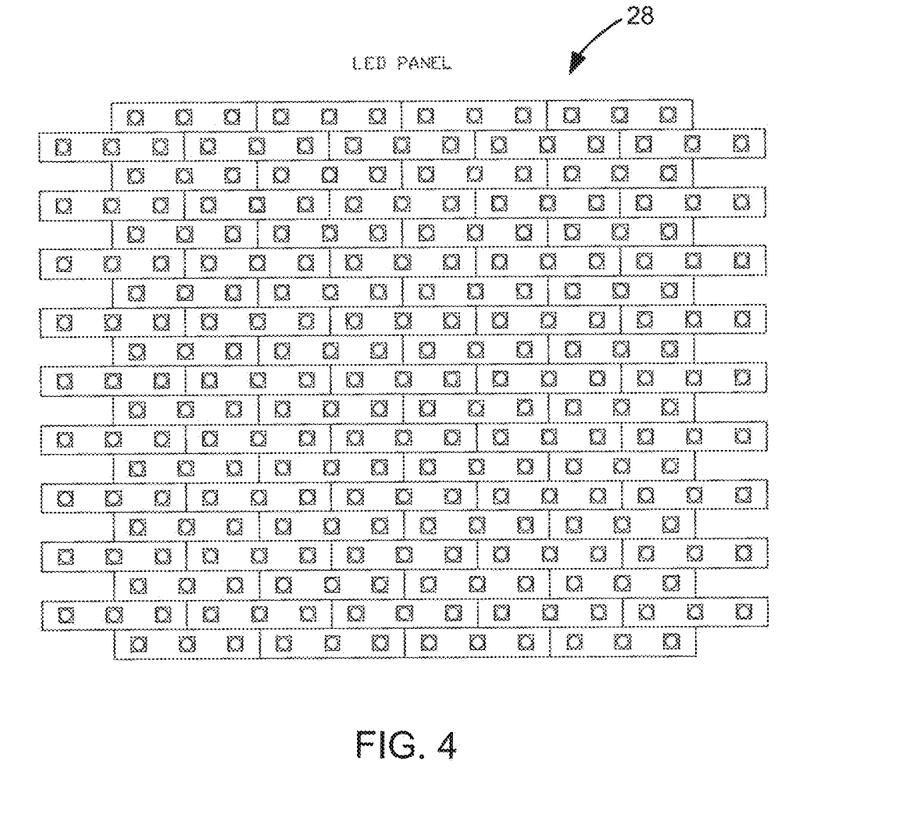
FIG. 4 is a top view of an LED panel formed from an array of a plurality of staggered strips of LED chips.

FIG. 4 shows the LED panel 28 having a plurality of strips 10. Unlike the array 30 of strips 10 shown in FIG. 2, the strips 10 of the panel 28 are two different sizes (i.e., width and number of chips 12) and are alternatingly positioned so that the chips 12 in one strip 10 are staggered with respect to chips 12 from an adjacent strip 10.

Figure 5:
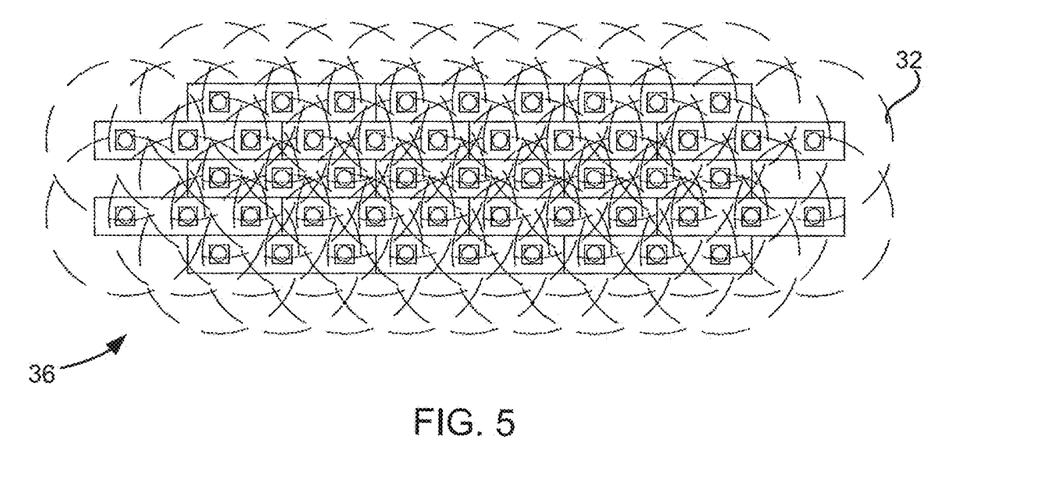
FIG. 5 is a top plan view of an array of a plurality of staggered strips of LED chips illustrating overlapping light exposer (i.e., emission cone) from each of the LED chips.

FIG. 5 shows an array 36 of LED strips 10 in a staggered arrangement (i.e., similar to that shown in FIG. 4). In this arrangement, the emission cones 32 of the chips 12 overlap in a more complex pattern. This is also illustrated in the side view of FIG. 6. Moreover, every other strip can be configured to have three different wavelengths (from three different power sources and pulse width modulators) from the adjacent strips 10. In this arrangement, every two adjacent strips provide six different wavelength outputs.

Figure 6:
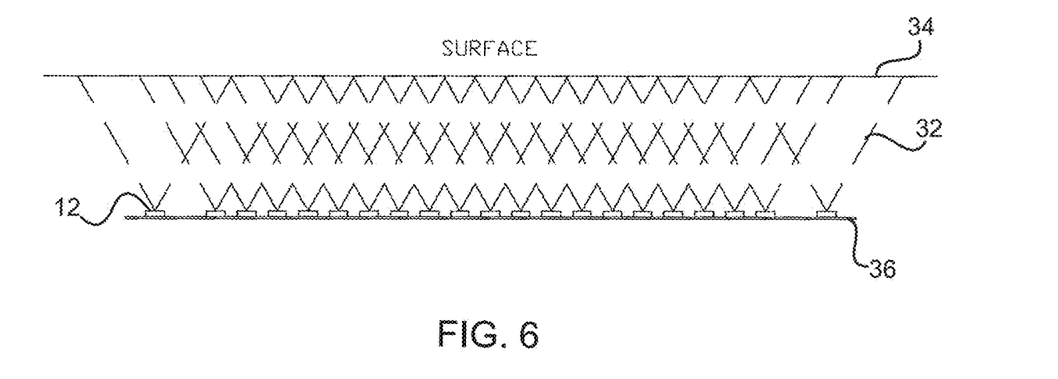
FIG. 6 is a side plan view of the array of FIG. 5 with a substrate surface exposed to the LED chips.

Referring to FIGS. 3 and 6, the LED panel (or array) is preferably set at the optimum distance from the substrate 34 to ensure homogenous overlap of the emission cones 32 of each chip 12 with all adjacent chips 12 in the grid.

Figure 8:
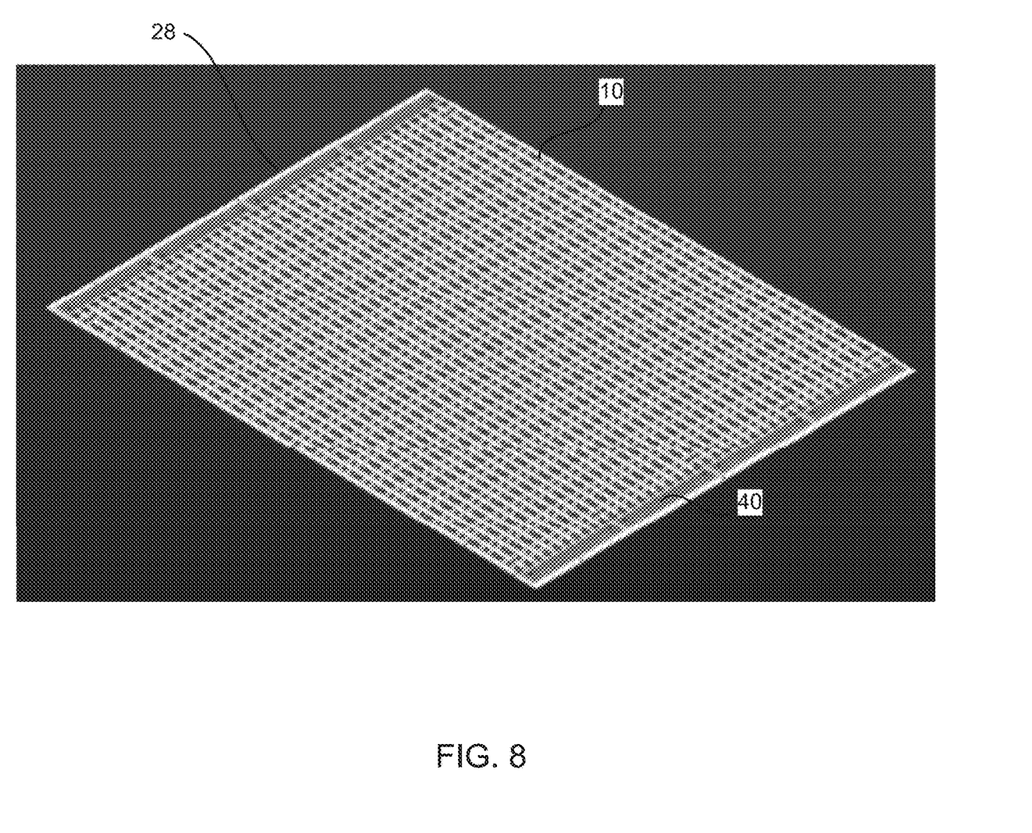

The LED panel 28 includes an aluminum plate 38 with specially routed termination circuit boards 40 at either end of the strips 10. A plurality of LED strips 10 are attached to the plate 38 and are soldered to the termination boards 40. The size of the panel 28 can be adjusted by adding or subtracting strips 10, as well as by adjusting the width of the strip 10 and by adding or subtracting LED chips 12 to each strip 10.

Figure 9:
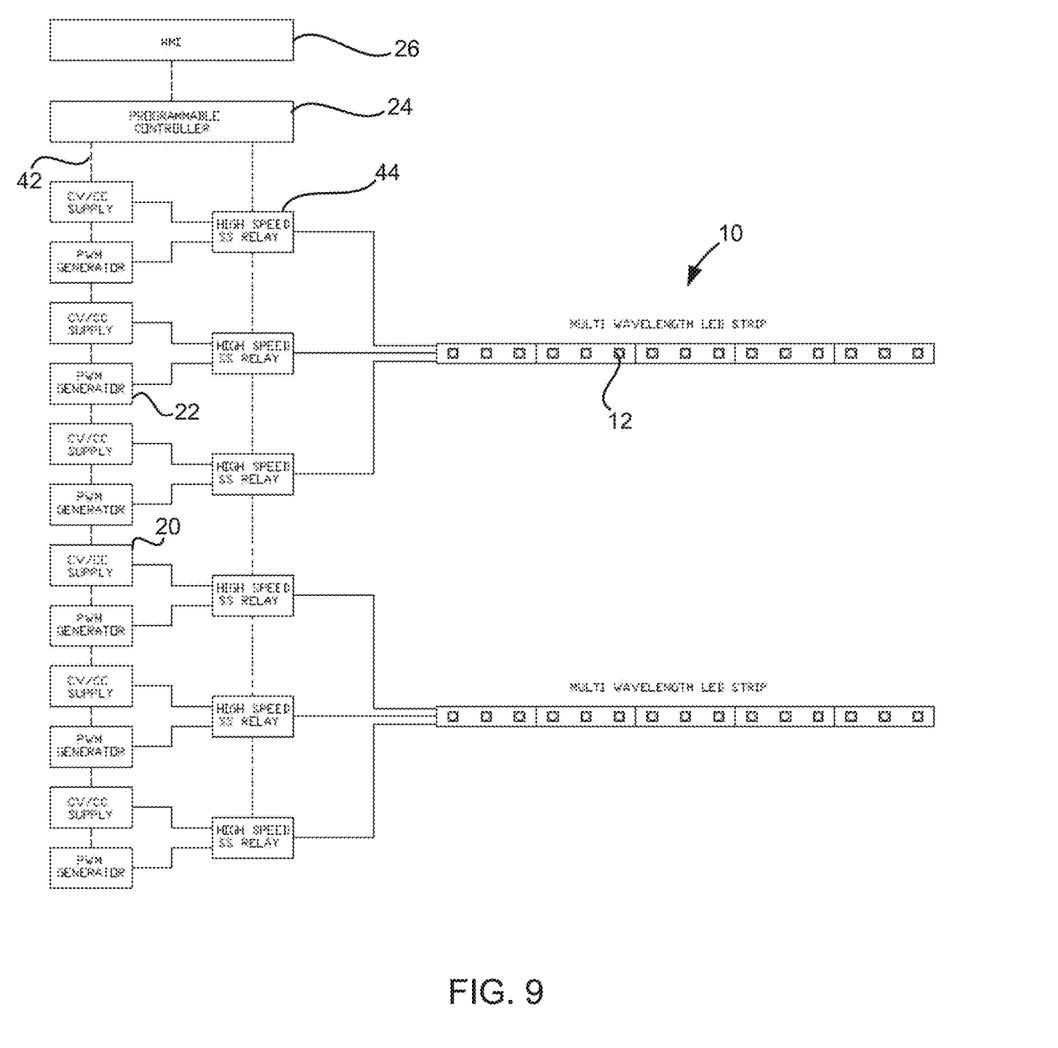

Power is fed to the termination boards 40 from three separate power supplies 14, 16, 18, each independently controlled for voltage and current output, through high speed, solid state relays 44 as shown in FIG. 9. Control inputs for the high speed relays 44 are connected to a multi-channel PWM (pulse width modulation) circuit 22 where each channel is independently controllable for a duty cycle from 0-100% at 1 KHz. Both the PWM circuit 22 and power supplies 20 can be controlled using analog outputs 42 from the programmable controller 24 and user interface 26. This results in direct, independent and precise control of spectral output (individual wavelength peak amplitude and duty cycle), timing sequence, and on/off control of the LED chips. The controller 24 can also provide for storage and recall of preset exposure routines.

Many modifications and variations of the present invention are possible in light of the above teachings. It is, therefore, to be understood within the scope of the appended claims the invention may be protected otherwise than as specifically described.

I claim:

1. A UV exposure system for comprising:
a panel having a plurality of UV LED chips;
each of the plurality of UV LED chips is connected to a first controllable power source for producing a first output wavelength and each of the plurality of UV LED chips is connected to a second controllable power source for producing a second output wavelength different than the first output wavelength, and where each of the first and second controllable power sources is set at a different output value.

2. The system of claim 1 wherein the panel comprises a plurality of strips where each strip includes a portion of the plurality of UV LED chips.

3. The system of claim 2 wherein adjacent strips of the plurality of strips are positioned to stagger the UV LED chips.

4. The system of claim 1 wherein the first controllable power source is connected to a first controllable pulse width modulation circuit, and the second controllable power source is connected to a second controllable pulse width modulation circuit.

5. The system of claim 4 wherein the first pulse width modulation circuit can control a duty cycle of each chip from 0% 100% at 1 KHz.

6. The system of claim 1 wherein the first controllable power source is adjustable, and the second controllable power source is adjustable independently from the first power source.

7. The system of claim 1 wherein the first controllable power source is controlled by a programmable logic controller, and the second controllable power source is controlled by the programmable logic controller.

8. The system of claim 7 further including a human machine interface.

9. The system of claim 1 wherein each UV LED chip includes a plurality of different wavelength dies under a single lens.

10. The system of claim 1 wherein the first power source is a constant voltage, constant current supply.

11. The system of claim 1 wherein each of the plurality of UV LED chips is connected to a third controllable power source for controlling a third output wavelength different than the first output wavelength and the second output wavelength, and where each of the first power controllable power source, the second controllable power source and the third controllable power source is set at a different value.

12. The system of claim 11 wherein the first power source is connected in parallel to the plurality of UV LED chips, the second power source is connected in parallel to the plurality of UV LED chips and the third power source is connected in parallel to the plurality of UV LED chips.

13. The system of claim 1 wherein the first power source is connected in parallel to the plurality of UV LED chips and the second power source is connected in parallel to the plurality of UV LED chips.

14. A tuneable UV exposure system for curing a substance on a substrate in a screen printing operation comprising:
    a panel comprising a plurality of strips, each strip containing a plurality of UV LED chips;
    first adjustable power source connected to each of the UV LED chips on each of the plurality of strips for producing a first output wavelength; and,
    a second adjustable power source connected to each of the UV LED chips on each of the plurality of strips for producing a second output wavelength different than the first output wavelength.

15. The system of claim 14 wherein adjacent strips of the plurality of strips are positioned to stagger the UV LED chips on the adjacent strips.

16. The system of claim 14 wherein the first power source is connected to a first pulse width modulation circuit, and the second power source is connected to a second pulse width modulation circuit.

17. The system of claim 16 wherein the first pulse width modulation circuit can control a duty cycle of each chip from 0% 100% at 1 KHz.

18. The system of claim 14 wherein the first power source is controlled by a programmable logic controller.

19. The system of claim 14 wherein each UV LED chip includes a plurality of different wavelength dies under a single lens.

20. The system of claim 14 further comprising a third adjustable power source connected to each of the UV LED chips on each of the plurality of strips for producing a third output wavelength different than the first output wavelength and the second output wavelength.

21. The system of claim 14 wherein the panel is positioned to expose a surface of a substrate in a screen printing apparatus.

22. The system of claim 14 wherein the substrate is an emulsion coated screen.

\* \* \* \* \*